(12) United States Patent
Choi et al.

(10) Patent No.: US 6,342,427 B1
(45) Date of Patent: Jan. 29, 2002

(54) METHOD FOR FORMING MICRO CAVITY

(75) Inventors: Chang Auck Choi; Chi Hoon Jun; Won Ick Jang; Yun Tae Kim, all of Taejon (KR)

(73) Assignee: Electronics and Telecommunications Research Institute, Taejon (KR)

( * ) Notice: Subject to any disclaimer, the term of this patent is extended or adjusted under 35 U.S.C. 154(b) by 0 days.

(21) Appl. No.: 09/473,968

(22) Filed: Dec. 29, 1999

(30) Foreign Application Priority Data

Dec. 2, 1999 (KR) .............................................. 99-54394

(51) Int. Cl.$^7$ ........................... H01L 21/00; C23F 1/00; B44C 1/22
(52) U.S. Cl. ...................... 438/422; 438/212; 438/421; 438/400; 216/2; 216/41
(58) Field of Search ................................ 438/422, 212, 438/421, 400; 216/2, 41

(56) References Cited

U.S. PATENT DOCUMENTS

| | | | |
|---|---|---|---|
| 4,888,300 A | * 12/1989 | Burton ........................ 438/404 |
| 5,203,731 A | * 4/1993 | Zimmerman ................. 445/24 |
| 5,296,408 A | 3/1994 | Wilbarg et al. ............. 437/203 |
| 6,211,056 B1 | * 4/2001 | Begley et al. .............. 438/619 |

OTHER PUBLICATIONS

Parameswaran, et al.; Silicon Pressure Sensors Using a Wafer–Bonded Sealed Cavity Process; Jun. 25–29, 1995; pp. 582–585.

Liu, et al.; Sealing of Micromachined Cavities Using Chemical Vapor Deposition Methods: Characterization and Optimization; Jun. 1999; pp. 135–145.

* cited by examiner

*Primary Examiner*—Gregory Mills
*Assistant Examiner*—P. Hassanzadeh
(74) *Attorney, Agent, or Firm*—Jacobson Holman, PLLC

(57) ABSTRACT

A method for forming a micro cavity is disclosed. In the method for forming the cavity, a first layer is formed on a silicon layer and a trench is formed in the silicon layer by selectively etching the silicon layer. A second and a third layers are formed on the trench and on the silicon layer. Etching holes are formed through the third layer by partially etching the third layer. A cavity is formed between the silicon layer and the third layer after the second layer is removed through the etching holes. Therefore, the cavity having a large size can be easily formed and sealed in the silicon layer by utilizing the volume expansion of the silicon or the poly silicon layer. Also, a vacuum micro cavity can be formed according as a low vacuum CVD oxide layer or a nitride layer formed on the etching holes which are partially opened after the thermal oxidation process by controlling the size of the etching holes concerning the other portion of the poly silicon layer.

19 Claims, 4 Drawing Sheets

METHOD FOR FORMING MICRO CAVITY

BACKGROUND OF THE INVENTION

The present invention relates to a method for forming a cavity in a silicon layer and, more particularly to a method for forming a micro cavity in a silicon layer by the conventional semiconductor manufacturing process, which can be suitable for manufacturing various semiconductor sensors, minute vacuum devices or micro electro mechanical systems.

In general, two kinds of methods for forming a cavity in silicon substrate have been known. The first method is applied to form a cavity having a relatively large size. As for the first method, a sacrificial oxide layer is filled in a portion of a silicon substrate where the cavity will be formed and a thin film having an etch selectivity different from that of the oxide layer is formed on the oxide layer as a shape of a mold. Then, the sacrificial layer is removed by etching through an etching hole or an etching channel to form the cavity in the silicon substrate after the etching hole is formed through the thin film. Finally, the cavity is sealed by thin film deposition process.

When the cavity has a relatively small size, the second method disclosed at U.S. Pat. No. 5,296,408 (issued to Robert R. Wilbarg et al.) is suitable for forming the cavity. In the second method, a metal is buried in a portion of a silicon substrate where the cavity will be formed. In order to fill up the cavity the metal should be thermally diffused for a sacrificial material such as aluminum.

When the cavity has a large size, the above-mentioned methods, however, may have some disadvantages that the etching selectivities of the thin films may not be exactly controlled for forming the cavity, the processing time may increases and the flatness of the substrate is hardly maintained.

SUMMARY OF THE INVENTION

Considering the above-mentioned problems, it is an object of the present invention to provide a method for forming a micro cavity, which can enable additional patterns and devices such as temperature detecting device to be easily formed on a silicon oxide layer by forming the silicon oxide layer on a silicon layer as a sealing layer for the cavity.

It is another object of the present invention to provide a method for forming a micro cavity, which can easily form the cavity to have a large size by utilizing the conventional etching and oxidation processes.

To achieve the above-mentioned objects of the present invention, there is provided a method for forming a micro cavity.

In the method for forming the micro cavity according to the present invention, a first layer is formed on a silicon layer and a trench is formed in the silicon layer by selectively etching the silicon layer. The first layer has an etch selectivity different from the silicon layer and is composed of a silicon oxide deposited by a low pressure chemical vapor deposition method. The trench formed by using the first layer as an etching mask has a shape in which a plurality of lines and a plurality of spaces alternatively repeated. Preferably, a ratio of widths between the lines and the spaces is about 0.7~1.0:1.0~1.3.

Subsequently, a second layer having an etch selectivity different from the silicon layer is formed on the trench and on the silicon layer. The thickness of the second layer is preferably more than a half of a width of the line. The second layer can be composed of a silicon oxide formed by a thermal oxidation method at a temperature of about 950° C. to about 1100° C.

A third layer is formed on the second layer after a portion of the second layer formed on the silicon layer is removed by using a 6:1 buffered hydrogen fluoride solution as an etchant. The third layer has an etch selectivity different from the second layer and the silicon layer can be composed of a poly silicon deposited by a low pressure chemical vapor deposition method at a temperature of about between about 600° C. and about 650° C.

A plurality of etching holes having hexagonal shapes or circular shapes are formed through the third layer by partially etching the third layer, and then the second layer is removed through the etching holes by a wet etch method and by using a hydrogen fluoride solution as an etchant.

Finally, a cavity is formed between the silicon layer and the third layer.

According to one preferred embodiment of the present invention, the method for forming the micro cavity further comprises the step of closing the etching holes by thermally oxidizing the third layer.

Also, according to another preferred embodiment of the present invention, the method for forming the micro cavity further comprises the step of partially closing the etching holes by thermally oxidizing the third layer and vacuumizing the cavity by depositing an oxide layer or a nitride layer on the third layer by a chemical vapor deposition method under a low vacuum atmosphere.

The ratio of the volume expansion is generally about 2.27 when the silicon layer or the poly silicon layer is transformed into the silicon oxide layer. In other words, the silicon layer has the volume about 2.27 times larger than the volume of the silicon layer or the poly silicon layer. Therefore, the etching holes can be completely closed due to the volume expansion of the third layer.

Meanwhile, in a process for forming a vacuum cavity according to another embodiment of the present invention, the etching holes have larger sizes in order to be partially opened after the third layer is thermally oxidized considering the volume expansion of the third layer. That is, the etching holes have the size larger than the increased area of other portion of the third layer during the thermal oxidation process. Thus, the etching holes are not completely closed but partially opened, so the vacuum cavity can be formed after the CVD oxide layer or the nitride layer is formed on the third layer having the partially opened etching holes under the low vacuum atmosphere.

According to the present invention, the cavity can be easily formed and sealed in the silicon layer by utilizing the volume expansion of the silicon or the polysilicon layer and by the conventional semiconductor manufacturing technique according to the present invention.

Also, the subsequent processes such as the photolithography process and the thermal oxidation process can be facilely accomplished because the polysilicon layer is evenly formed and covered with the cavity in the silicon layer.

Furthermore, the vacuum micro cavity can be formed according as the low vacuum CVD oxide layer or a nitride layer formed on the etching holes which are partially opened after the thermal oxidation process by controlling the size of the etching holes concerning the other portion of the poly silicon layer as occasion demands.

BRIEF DESCRIPTION OF THE DRAWINGS

The above objects and other advantages of the present invention will be more apparent by describing in detail the preferred embodiments thereof with reference to the attached drawings, in which.

DETAILED DESCRIPTION OF THE INVENTION

Hereinafter, the preferred embodiments of the present invention will be explained in more detail with reference to the accompanying drawings.

FIGS. 1A to 1H illustrate manufacturing steps for forming a micro cavity in a silicon layer in accordance with preferred embodiments of the present invention.

Figure 1A:
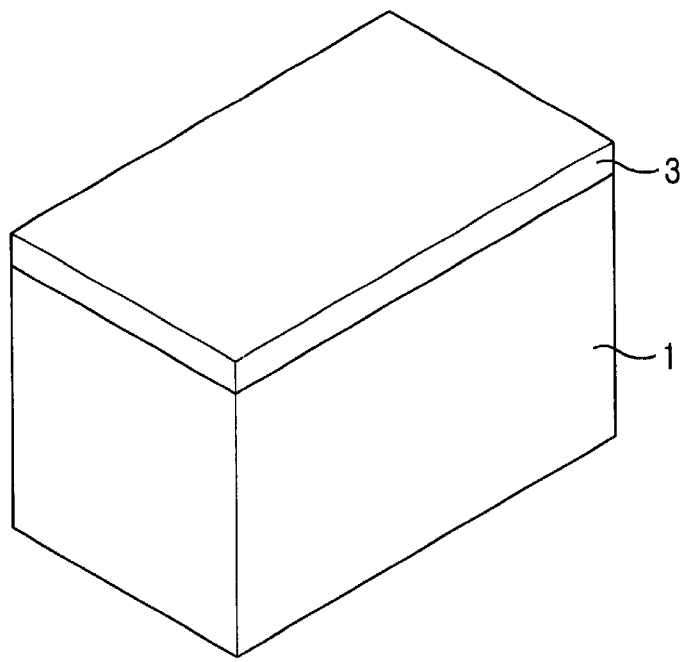
FIGS. 1A to 1H are perspective views for illustrating manufacturing process for forming a micro cavity according to the present invention.
Figure 1B:
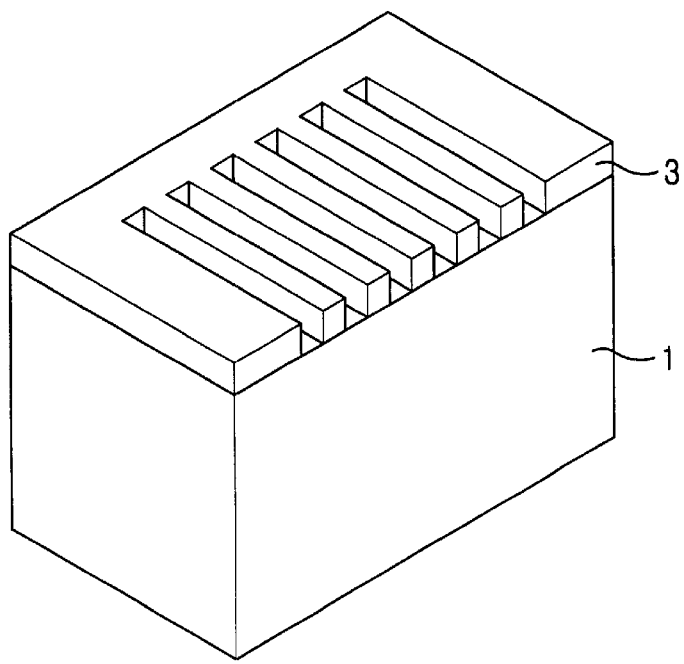
Figure 1C:
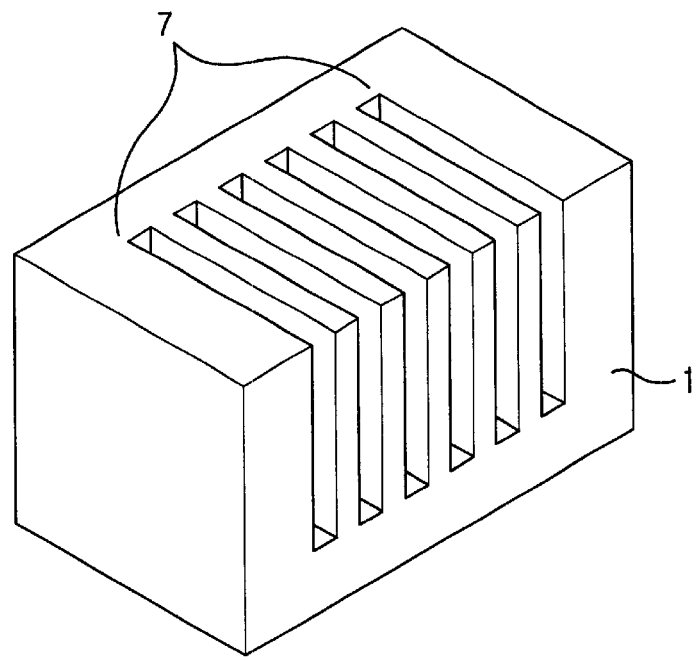

FIGS. 1A to 1C are perspective view for illustrating the steps for forming trench 7 in a silicon layer 1. The trench 7 has the shapes in which a plurality of lines and spaces are repeatedly formed.

The silicon layer 1 is a silicon substrate, a silicon wafer, a silicon thin film or an epitaxially grown silicon thin film. The ratio of the widths of the line and the space is about 0.7~1.0:1.0~1.3, preferably about 0.9:1.1. As for forming the trench 7 having the shape of alternatively repeated lines and spaces, one preferred method of the present invention for forming the trench is illustrated in FIGS. 1A to 1C though various methods for forming the trench may exist.

Referring to FIG. 1A, a first layer 3 which functions as a hard mask is formed on the silicon layer 1. Preferably, the first layer 3 is formed with using a material such as silicon oxide having the etch selectivity different from the silicon layer 1 and by a low pressure chemical vapor deposition (LPCVD).

As shown in FIG. 1B, a photo resist layer (not shown) is subsequently formed on the first layer 3 and patterned to form a photo resist pattern (not shown) for patterning the first layer 3 according to the conventional photolithography method. Then, the first layer 3 under which the cavity will be formed is partially etched by using the photo resist pattern as an etching mask so as to form the trench 7 having the lines and the spaces in the silicon layer 1. At that time, the ratio of the width of the line and the space is about 0.7~1.0:1.0~1.3, preferably about 0.9:1.1. For example, the width of the line is about 0.9 μm when the width of the space is about 1.1 μm or the width of the line is about 1.8 μm when the width of the space is about 2.2 μm.

When the ratio of width of the line and the space is about 0.8:1.1, the space of the trench 7 is not filled with oxidation layer after thermal oxidation process. According to another embodiment of the present invention, the aperture of the space of the trench 7 can be filled with an additional oxide layer by chemical vapor deposition method (CVD).

Subsequently, the silicon layer 1 is partially etched to a predetermined depth by reactive ion etching (RIE) process and by using the first layer 3 as the hard mask. In this case, the silicon layer 1 is vertically etched to form the trench 7 having the spaces and the lines. Then, the first layer 3 is etched by using an etchant such as 6:1 buffered hydrogen fluoride (BHF) solution to complete the trench 7 which has alternatively repeated lines and spaces as shown in FIG. 1C.

Figure 1D:
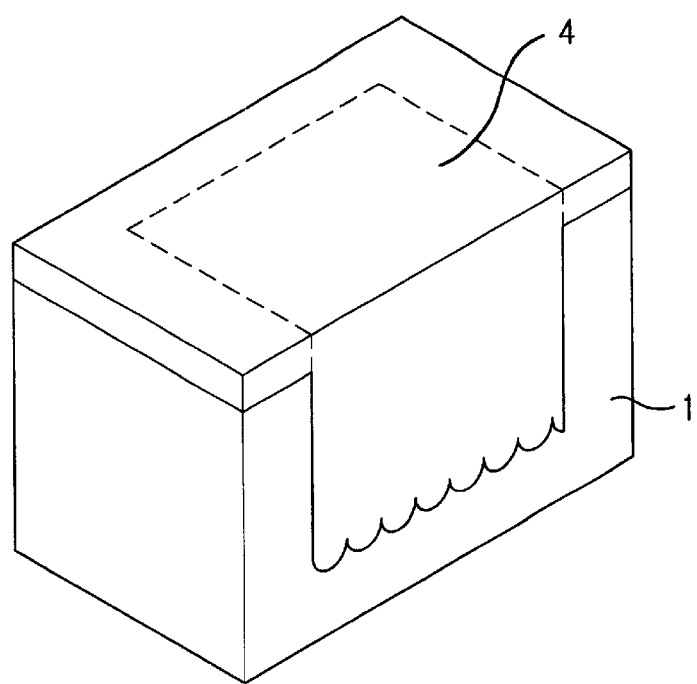

FIG. 1D is a schematic perspective view for showing a state in which a second layer 4 is formed on the silicon layer 1 and the trench 7 having the lines and the spaces.

Referring to FIG. 1D, the second layer 4 is formed on the silicon layer 1 to cover the trench 7 by a thermal oxidation process according to the present invention. At that time, the thermal oxidation process is executed in a diffusion furnace at a temperature of about 950 to about 1100° C. under an oxygen atmosphere. In the thermal oxidation process, an upper portion of the silicon layer 1 is oxidized to a predetermined depth more than an half of the width of the line of the trench 7, so the second layer 4 is formed as the thermal oxidized portions of the silicon layer 1 grow from the lateral portions of the lines to the spaces. Therefore, the trench 7 is filled with the second layer 4 composed of the silicon oxide.

Figure 1E:
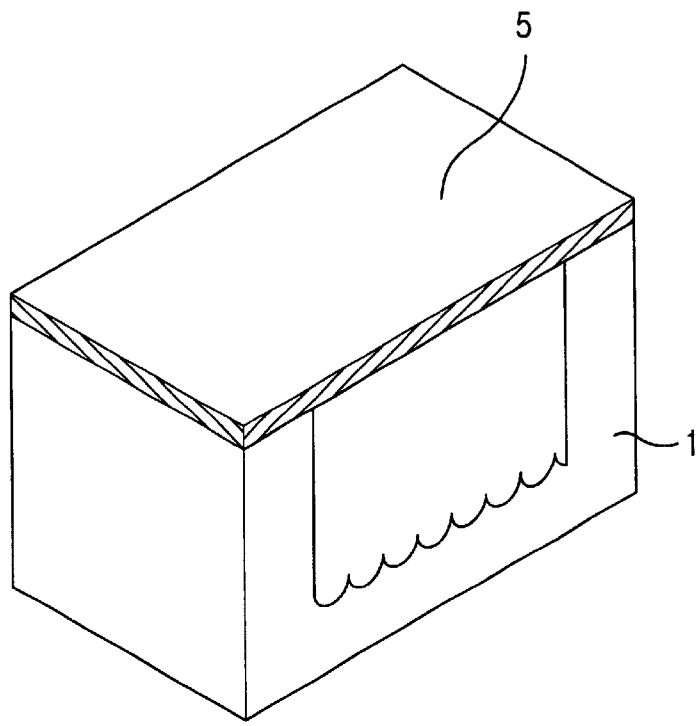

FIG. 1E is a perspective view for illustrating a step for forming a third layer 5 on the silicon layer 1 and on the second layer 4 formed in the trench 7.

Referring to FIG. 1E, a portion of the second layer 4 formed on the silicon layer 1 is removed by using an etchant such as 6:1 buffered hydrogen fluoride (BHF) solution except second portions of the second layer 4 formed in the trench 7. Subsequently, the third layer 5 which has the etch selectivity different from the silicon or the silicon oxide is formed on the silicon layer 1 and on the second layer 4 formed in the trench 7. The third layer 5 is formed by using a silane ($SiH_4$) gas at a temperature of between about 600° C. and about 650° C. preferably, about 625° C. That is, the third layer 5 is made of poly silicon having a predetermined thickness by a LPCVD method.

Figure 1F:
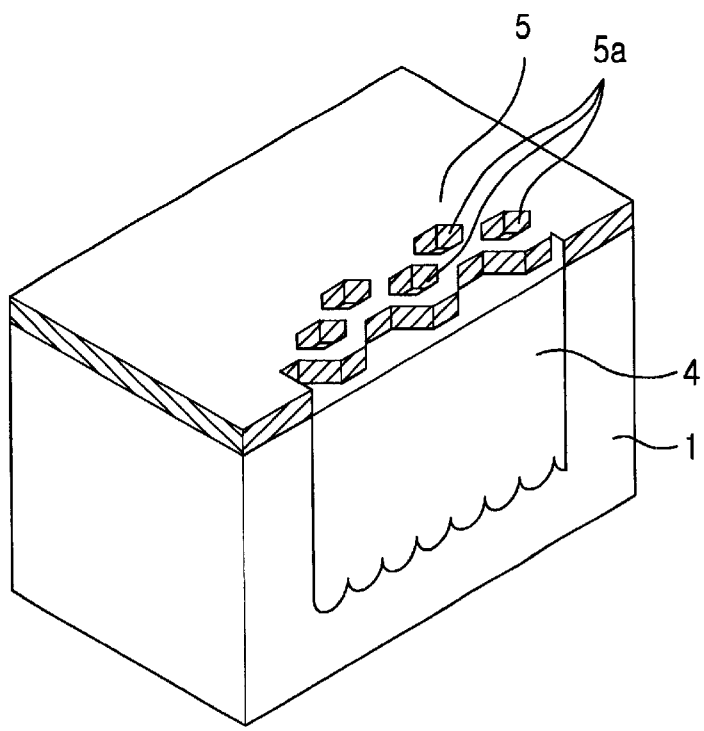

Then, the third layer 5 under which the cavity 6 will be formed is partially etched to form a plurality of minute holes 5a having hexagonal shapes or circular shapes as shown in FIG. 1F which illustrates a step for forming etching holes 5a through the third layer 5. When the third layer 5 changes into a silicon oxide layer during a subsequent thermal oxidation process, a volume expansion occurs so that stress generates from the volume expansion from the poly silicon layer to the silicon oxide layer. At that time, the holes 5a can sufficiently release the stress since the holes 5a have the hexagonal shapes or the circular shapes. Also, when the third layer 5 is thermally oxidized, the holes 5a may be closed or opened due to the volume expansion according to the pre-controlled ratio of the areas between the holes 5a and the other portion of the third layer 5. Namely, the diameters of the holes 5a can be designed such as they have the areas larger than the increased area due to the volume expansion or have the area smaller than the increased area considering the volume expansion of the third layer 5.

Figure 1G:
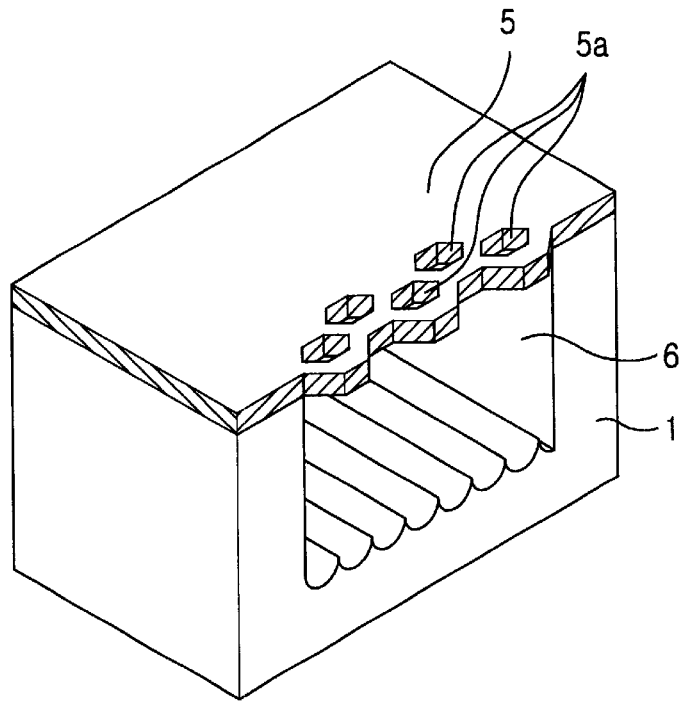

FIG. 1G illustrates a step for forming the cavity 6 in the silicon layer 1.

Referring to FIG. 1G, the second layer 4 formed on the trench 7 is removed to form the cavity 6 in the silicon layer 1 by a wet etch process through the minutes holes 5a of the third layer 5. In this case, the second layer 4 is etched by using a hydrogen fluoride solution which has large etch selectivity concerning the third layer 5 and the second layer 4.

Figure 1H:
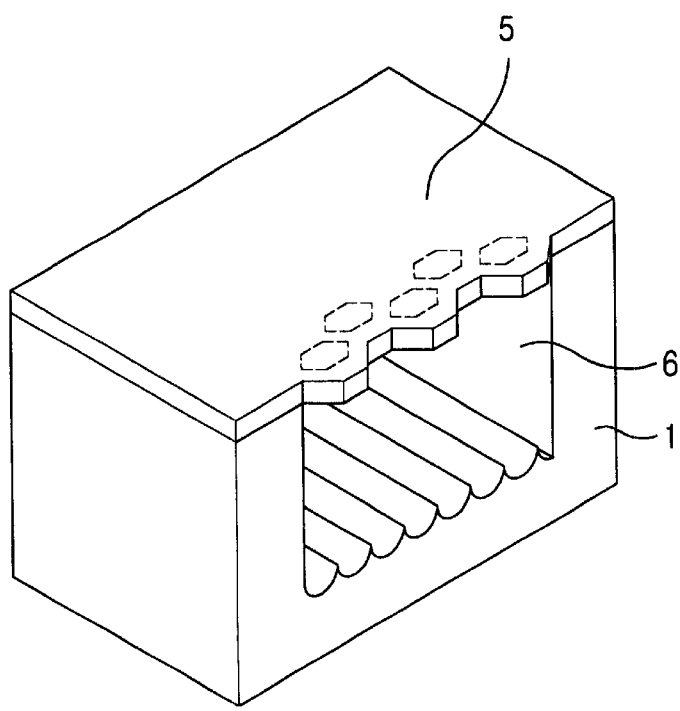

Subsequently, the third layer 5 is thermally oxidized to complete the cavity 6 in the silicon layer 1 as shown in FIG. 1H. When the third layer 5 is thermally oxidized, the third layer 5 composed of the poly silicon changes into the silicon oxide layer. Therefore, the holes 5a of the third layer 5 are closed due to the volume expansion and the cavity 6 is sealed with the third layer 5 composed of the silicon oxide and the silicon layer 1, so the cavity 6 forming step is completed. In general, the ratio of the volume expansion is about 2.27 when the silicon layer or the poly silicon layer is transformed into the silicon oxide layer. That is, the silicon layer has the volume about 2.27 times larger than the volume of the silicon layer or the poly silicon layer. Hence, the holes 5a of the third layer 5 can be completely closed due to the volume expansion of the third layer 5.

In a process for forming a vacuum cavity, the holes 5a of the third layer 5 can have larger sizes in order to be partially opened after the third layer 5 is thermally oxidized considering the volume expansion of the third layer 5. That is, the holes 5a can have the size larger than the increased area of other portion of the third layer 5 during the thermal oxidation process. Thus, the holes 5a are not closed but partially opened so that the vacuum cavity can be formed after a CVD oxide layer or a nitride layer is formed on the third layer 5 having the partially opened holes 5a under a low vacuum atmosphere.

As it is described above, the cavity having a large size can be easily formed and sealed in the silicon layer by utilizing the volume expansion of the silicon or the polysilicon layer and by the conventional semiconductor process according to the present invention.

Also, the successive processes such as the photolithography process and the thermal oxidation process can be facilely accomplished because the polysilicon layer is levelly formed and covered with the cavity in the silicon layer.

Furthermore, the vacuum micro cavity can be formed according as the low vacuum CVD oxide layer or a nitride layer formed on the etching holes which are partially opened after the thermal oxidation process by controlling the size of the etching holes concerning the other portion of the poly silicon layer as occasion demands.

While the present invention has been particularly shown and described with reference to preferred embodiments thereof, it will be understood by those skilled in the art that various changes in form and detail may be effected therein without departing from the spirit and scope of the invention as defined by the appended claims.

What is claimed is:

1. A method for forming a micro cavity, comprising the steps of:
   forming a first layer on a silicon layer;
   forming a trench in said silicon layer by selectively etching said silicon layer by using said first layer as an etching mask;
   forming a second layer on said trench and on said silicon layer;
   forming a third layer on said second layer;
   forming a plurality of etching holes through said third layer by partially etching said third layer;
   removing said second layer through said etching holes; and
   forming a cavity between said silicon layer and said third layer, wherein said trench has a plurality of lines and a plurality of spaces alternatively repeated and is formed perpendicular to a surface of the silicon layer.

2. The method for forming a micro cavity as claimed in claim 1, wherein said first layer has a different etch selectivity from said silicon layer.

3. The method for forming a micro cavity as claimed in claim 2, wherein said first layer is composed of a silicon oxide deposited by a low pressure chemical vapor deposition method.

4. The method for forming a micro cavity as claimed in claim 1, wherein a thickness of said second layer is more than a half of a width of the line.

5. The method for forming a micro cavity as claimed in claim 1, wherein a ratio of widths of the lines and the spaces is about 0.7~1.0:1.0~1.3.

6. The method for forming a micro cavity as claimed in claim 1, wherein said second layer has a different etch selectivity from said silicon layer.

7. The method for forming a micro cavity as claimed in claim 6, wherein said second layer is composed of a silicon oxide formed by a thermal oxidation method at a temperature of between about 950° C. and about 1100° C.

8. The method for forming a micro cavity as claimed in claim 1, wherein the step for forming said third layer is performed after a portion of said second layer formed on said silicon layer is removed by using a 6:1 buffered hydrogen fluoride solution as an etchant.

9. The method for forming a micro cavity as claimed in claim 1, wherein said third layer has a different etch selectivity from said second layer and the silicon layer.

10. The method for forming a micro cavity as claimed in claim 9, wherein said third layer is composed of a poly silicon deposited by a low pressure chemical vapor deposition method at a temperature of about between about 600° C. and about 650° C.

11. The method for forming a micro cavity as claimed in claim 1, wherein said etching holes have hexagonal shapes or circular shapes.

12. The method for forming a micro cavity as claimed in claim 1, wherein said second layer is removed by a wet etch method and by using a hydrogen fluoride solution as an etchant.

13. The method for forming a micro cavity as claimed in claim 1, further comprising the step of closing said etching holes by thermally oxidizing said third layer.

14. The method for forming a micro cavity as claimed in claim 1, further comprising the step of partially closing said etching holes by thermally oxidizing said third layer.

15. The method for forming a micro cavity as claimed in claim 14, further comprising the step of vacuumizing said cavity by depositing an oxide layer or a nitride layer on said third layer by a chemical vapor deposition method under a low vacuum atmosphere.

16. A method for forming a micro cavity, comprising the steps of:
   forming a first layer on a silicon layer;
   forming a trench in said silicon layer by selectively etching said silicon layer by using said first layer as an etching mask;
   forming a second layer on said trench and on said silicon layer;
   forming a third layer on said second layer;
   forming a plurality of etching holes through said third layer by partially etching said third layer;
   removing said second layer through said etching holes; and
   forming a cavity between said silicon layer and said third layer by thermally treating said third layer to close said etching holes, wherein said trench has a plurality of lines and a plurality of spaces alternatively repeated and is formed perpendicular to a surface of the silicon layer.

17. The method for forming a micro cavity as claimed in claim 16, wherein a ratio of widths of the lines and the spaces is about 0.9:1.1.

18. A method for forming a micro cavity, comprising the steps of:
   forming a first layer on a silicon layer;
   forming a trench in said silicon layer by selectively etching said silicon layer by using said first layer as an etching mask;
   forming a second layer on said trench and on said silicon layer;

forming a third layer on said second layer;

forming a plurality of etching holes through said third layer by partially etching said third layer;

removing said second layer through said etching holes; and partially closing said etching holes by thermally treating said third layer; and forming a vacuum cavity between said silicon layer and said third layer, wherein said trench has a plurality of lines and a plurality of spaces alternatively repeated and is formed perpendicular to a surface of the silicon layer.

19. The method for forming a micro cavity as claimed in claim 18, wherein the step of forming said vacuum cavity comprises the step of depositing an oxide layer or a nitride layer on said third layer by a chemical vapor deposition method under a low vacuum atmosphere.

* * * * *